United States Patent
Lee

(10) Patent No.: US 8,117,582 B2
(45) Date of Patent: Feb. 14, 2012

(54) METHOD FOR PLACING DUMMY PATTERNS IN A SEMICONDUCTOR DEVICE LAYOUT

(75) Inventor: Yong Geun Lee, Chungcheongbuk-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 765 days.

(21) Appl. No.: 12/183,036

(22) Filed: Jul. 30, 2008

(65) Prior Publication Data
US 2009/0044164 A1    Feb. 12, 2009

(30) Foreign Application Priority Data
Aug. 10, 2007   (KR) .................. 10-2007-0080570

(51) Int. Cl.
*G06F 17/50* (2006.01)
(52) U.S. Cl. .................. 716/122; 716/119; 716/135
(58) Field of Classification Search .............. 716/51, 716/52, 54, 55, 118, 119, 122, 132, 135
See application file for complete search history.

(56) References Cited

U.S. PATENT DOCUMENTS

| | | | |
|---|---|---|---|
| 2004/0243967 A1 | 12/2004 | Yamagiwa et al. | |
| 2008/0120586 A1* | 5/2008 | Hoerold | 716/9 |
| 2009/0013295 A1* | 1/2009 | Ji | 716/10 |

FOREIGN PATENT DOCUMENTS

| | | |
|---|---|---|
| CN | 1574217 A | 2/2005 |
| KR | 2002-0058521 A | 7/2002 |

OTHER PUBLICATIONS

Minoru Yamagiwa, Tadashi Tanimoto, Akio Misaka and Reiko Hinogami; "Semiconductor Design Layout Pattern Formation Method and Graphic Pattern Formation Unit"; Machine Translation of Abstract; Chinese Publication No. 1574217; Publication Date: Feb. 2, 2005; The State Intellectual Property Office of P.R.C., People's Republic of China.

Gye Hyeon Baek; "Method for Manufacturing Semiconductor Device"; Korean Patent Abstracts; Publication No. 1020020058521 A; Publication Date: Jul. 12, 2002; Korean Intellectual Property Office, Republic of Korea.

Chinese Office Action dated Aug. 14, 2009; Chinese Patent Application No. 2008101453605; The State Intellectual Property Office of P.R.C., People's Republic of China.

* cited by examiner

*Primary Examiner* — Vuthe Siek
(74) *Attorney, Agent, or Firm* — The Law Offices of Andrew D. Fortney; Andrew D. Fortney

(57) ABSTRACT

Disclosed is a method for placing dummy patterns in a semiconductor device layout. More specifically, the method places the dummy patterns densely between main patterns in accordance with a sequence and configuration. The method includes placing vertical dummies having a greater length than width in a region other than main patterns to form a first layout, removing the vertical dummies within a first distance from the main patterns to form a second layout, placing horizontal dummies having a greater length than width in a vacant space of the second layout to form a third layout, and removing the horizontal dummies within a second distance from the main patterns in the third layout. The method prevents and/or inhibits pattern deformation.

20 Claims, 6 Drawing Sheets

Vertical dummy

METHOD FOR PLACING DUMMY PATTERNS IN A SEMICONDUCTOR DEVICE LAYOUT

This application claims the benefit of the Korean Patent Application No. 10-2007-0080570, filed on Aug. 10, 2007, which is hereby incorporated by reference as if fully set forth herein.

BACKGROUND OF THE INVENTION

1. Field of the Invention

The present invention relates to a method for placing dummy patterns in a semiconductor device layout. More specifically, the present invention relates to a method for densely arranging dummy patterns between main patterns in accordance with a particular sequence and configuration.

2. Discussion of the Related Art

The development of micro-process techniques has brought about a reduction in semiconductor design rules, thus causing a gradual increase in pattern density and raising importance of accurate pattern formation.

It has become increasingly difficult to realize accurate micropatterning processes, in particular, metal patterning processes. In order to form sophisticated patterns, attempts have been made to solve such difficulties through artificial pattern manipulations such as optical proximity correction (OPC).

In addition, in another attempt to solve such difficulties, a technique wherein dummy patterns are interposed between main patterns has been used. This technique aims to prevent the occurrence of size differences of patterned structures according to the density of the main patterns during a photolithographic and/or etching process.

In subsequent planarization processes, differences in the planarization level of the main patterns may also occur according to the density of the main patterns. This planarization difference can be somewhat solved by interposing dummy patterns between the main patterns.

However, dummy patterns generally use rectangular patterns with a uniform size, which are problematic in that effects thereof are low, when the main patterns are microscopic or dense.

The reason for the problem is that when a uniform size of dummy patterns are arranged in a certain manner, and main patterns are closely arranged or conform to a minimum design rule, it is difficult to insert the dummy patterns close to the main patterns.

FIGS. 1A and 1B are an enlarged image and a scanning electron microscopy (SEM) image of a wafer surface including dummy patterns and main patterns of a general semiconductor device.

FIG. 1A is a view illustrating a state in which micro main patterns are formed in a desired shape. In FIG. 1A, the left image is a micrograph illustrating a magnified image of the wafer surface taken through a microscope and the right image is a SEM illustrating a magnified image of a micro main pattern.

In the left image, long metal lines and micro metal lines are seen, and rectangular dummies which are uniformly spaced apart from one another at the right side thereof are observed.

The right image of FIG. 1A is an SEM image illustrating a micro metal line at magnification. As can be seen from the right image, the micro pattern is suitably formed.

FIG. 1B is a view illustrating a state in which micro main patterns are not formed in a desired shape. In FIG. 1B, a left image is a micrograph illustrating a magnified image of the wafer surface taken through a microscope and a right image is a SEM image illustrating a magnified micro main pattern.

As can be seen from the right image of FIG. 1B, which is an SEM image illustrating a magnified micro metal line, the micro patterns are deformed.

The reason for the pattern deformation is that although being formed, the dummy patterns cannot sufficiently prevent the deformation of isolated micro metal patterns due to excessively large gaps between the main patterns and the dummy patterns. In order to prevent the pattern deformation, it is preferable that dummies be arranged as close to the main patterns as possible. In a case where box-type (e.g., square-shaped) dummies shown in FIGS. 1A and 1B are used, there is a limitation in reducing the distance between main patterns and the dummies through general arrangement methods.

SUMMARY OF THE INVENTION

Accordingly, the present invention is directed to a method for placing dummy patterns in a semiconductor device layout that substantially obviates one or more problems due to limitations and disadvantages of the related art.

An object of the present invention is to provide a method for placing dummy patterns in a semiconductor device in which the dummy patterns can be close to main patterns of a layout, and densely therebetween in accordance with a particular sequence and configuration.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose of the invention, as embodied and broadly described herein, a method for placing a dummy pattern in a semiconductor device comprises: placing vertical dummies having a greater length than width in a region other than main patterns to form a first layout; removing the vertical dummies within a first distance from the main patterns in the first layout to form a second layout; arranging horizontal dummies having a greater width than length in a vacant space of the second layout to form a third layout; and removing the horizontal dummies within a second distance from the main patterns in the third layout.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle(s) of the invention. In the drawings.

DETAILED DESCRIPTION OF THE INVENTION

Hereinafter, preferred embodiments of the present invention to realize the objectives of the invention will be illustrated with reference to the annexed drawings. Although certain structures, configurations and functions of the present invention may be illustrated in the accompanying drawings in conjunction with at least one embodiment, and described with reference to the accompanying drawings and the embodiment(s), the technical idea of the present invention and the important configurations and functions thereof are not limited thereto.

Although the technical terms as used herein are intended to be selected from those well-known in the art, they may be arbitrarily selected by the present inventors. In these cases, the meaning of these terms is illustrated in detail in the corresponding detailed description. Thus, the present invention may be understood based upon the ordinary meaning of the terms or an implicit meaning thereof as described herein.

FIGS. 2A to 2D are plan views illustrating a process for placing dummy patterns in a semiconductor device according to one embodiment of the present invention.

Figure 2A:
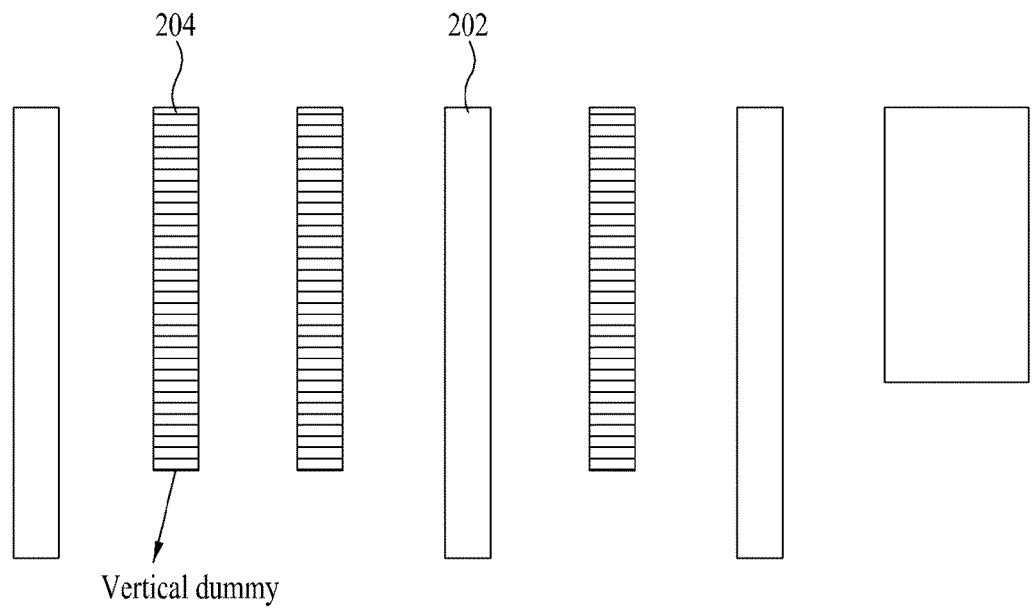
FIGS. 2A to 2D are plan views illustrating an exemplary process for placing dummy patterns in a semiconductor device layout according to the present invention.
Figure 2A:
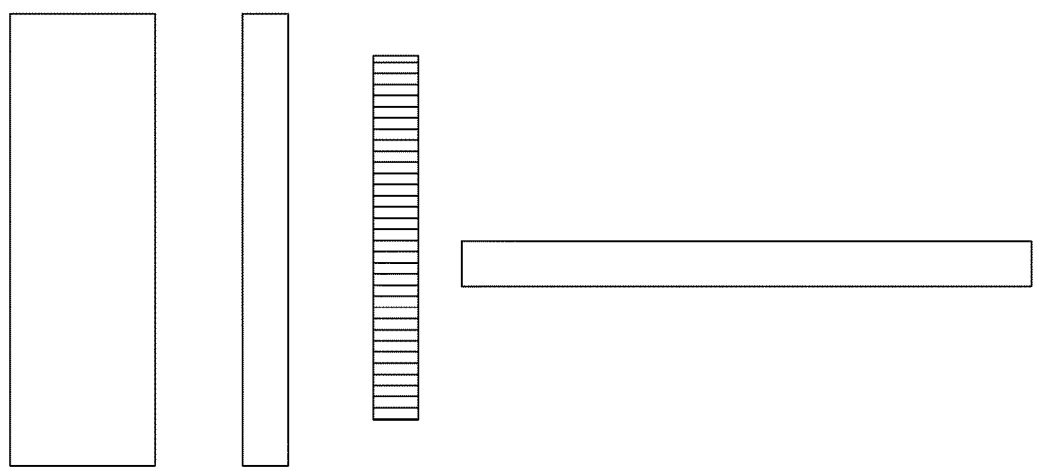

As shown in FIG. 2A, vertical dummies 204 are arranged in regions between main patterns 202 or regions other than the main patterns 202 to form a first layout. In general, the main patterns 202 refer to a pattern of metal structures on the semiconductor device, such as aluminum metallization, copper metallization, tungsten plugs, etc., but the main patterns 202 can also refer to polysilicon and/or metal silicide gates, or to corresponding patterns in a photoresist that masks the corresponding material in which the main pattern is formed (e.g., blanket-deposited aluminum metal when forming aluminum metallization, an insulator layer stack when forming copper metallization or tungsten plugs). Thus, in the case where the main patterns 202 refer to a structure to be used in the semiconductor device (e.g., aluminum metallization, copper metallization, tungsten plugs, polysilicon and/or metal silicide gates), the dummy structures may refer to actual structures in the semiconductor device that are electrically disconnected from other structures. In the case where the main patterns 202 refer to patterns in a photoresist, the dummy structures may refer to patterns in the photoresist that may or may not remain when the underlying (masked) material is etched. As a result, the invention relates to placing "dummy structures" onto a mask that is used for photolithographically defining the layer of material to be patterned, and/or into an electronic representation of the layout for that layer of material to be patterned or defined.

In one embodiment of the present invention, when dummies are a vertical type, they have a rectangular shape with a greater length than width, and when the dummies are a perpendicular type (e.g., horizontal), they have a rectangular shape with a greater width than length. However, the labels "vertical" and "horizontal" are somewhat arbitrary, and do not refer to an absolute orientation. Rather, one layout dimension (e.g., length or width, as opposed to thickness) may be arbitrarily considered to be "vertical" and the perpendicular or orthogonal layout axis (e.g., the remaining one of the width and length) may be arbitrarily considered to be "horizontal." As is explained in more detail below, the dummy structures are generally placed in parallel with nearby structures of the main patterns, whether vertical or horizontal. Here, the width of a rectangular dummy is defined as W, and the length thereof is defined as L. Hereinafter, a detailed explanation of the present invention will be provided below.

Figure 2B:
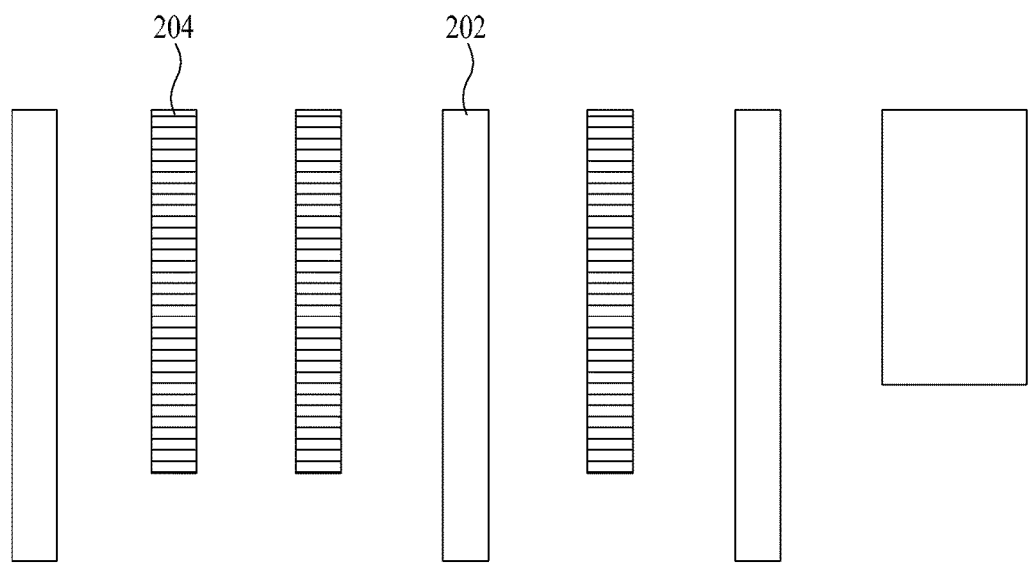
Figure 2B:
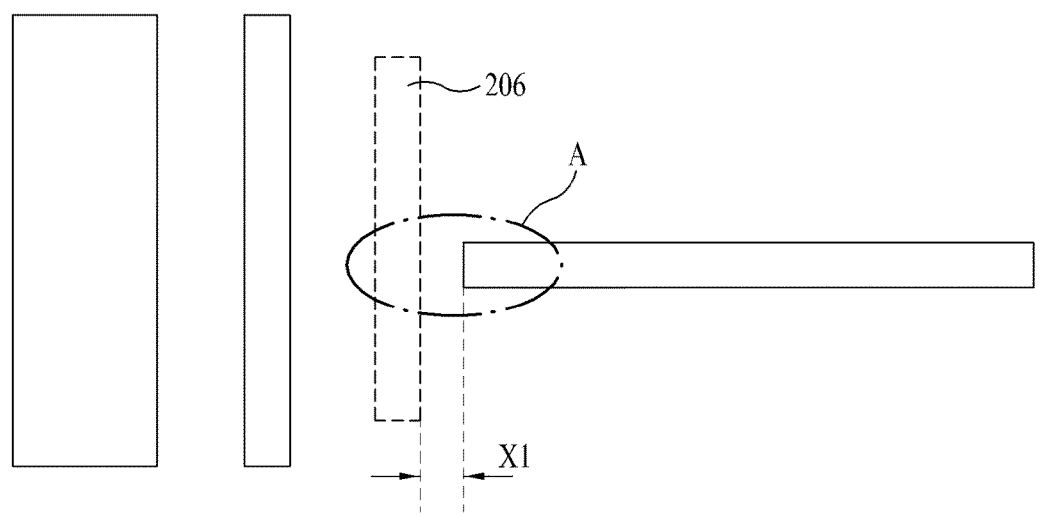

Referring to FIG. 2B, when a vertical dummy (e.g., 206) is spaced within a first distance X1 from the main pattern 202 in the first layout, the vertical dummy 206 is removed to form a second layout. In one embodiment, first distance X1 corresponds to a minimum design rule (e.g., for inter-feature spacing, or pitch, such as the minimum spacing required between adjacent metal lines in a layout for a particular or predetermined metal layer). When the distance between a main pattern line and a dummy does not conform with the minimum design rule (or rules) for that layer, the dummy (e.g., vertical dummy 206) is considered to be a rule-violation dummy, and it is removed from the electronic representation of the layout (e.g., the design of the integrated circuit or semiconductor device) before continuing.

The term "minimum design rule" as used herein refers to a minimum level, value or distance that satisfies the rule associated with the distance between adjacent line patterns during semiconductor fabrication processes. The term "first distance" as used herein refers to the distance between the main pattern 202 and the vertical dummy 204, which in various implementations may correspond to a multiple of the width W of the vertical dummy 204. The first distance may have a value not more than 1, 1.2, 1.25 or 1.5 times the width W of the vertical dummy 204.

For example, when the main pattern 202 is a metal line, the vertical dummy 204 may also be a metal line and a design rule is present in which the distance between adjacent metal lines should not be less than a predetermined value or level. The design rule may be the minimum design rule. When the design rule is contrary to the minimum design rule, a bridge phenomenon may occur, in which metal lines acting as the main patterns are connected with metal lines acting as the dummy patterns upon actual manufacture on a wafer.

For the aforementioned reason, the rule-violation vertical dummy 206, which is a distance from the main pattern 202 in violation of the minimum design rule, is removed to reduce, inhibit or prevent deformation which may occur upon actual realization of patterns on a wafer.

In one embodiment of the present invention, it may be assumed that the design rule in a case where the distance between the main pattern 202 and the vertical dummy 204 is less than 1.5 times the width W of the vertical dummy 204 violates the minimum rule. As can be seen from FIG. 2B, rule violation occurs in the part "A," and the corresponding dummy 206 is thus removed.

Figure 2C:
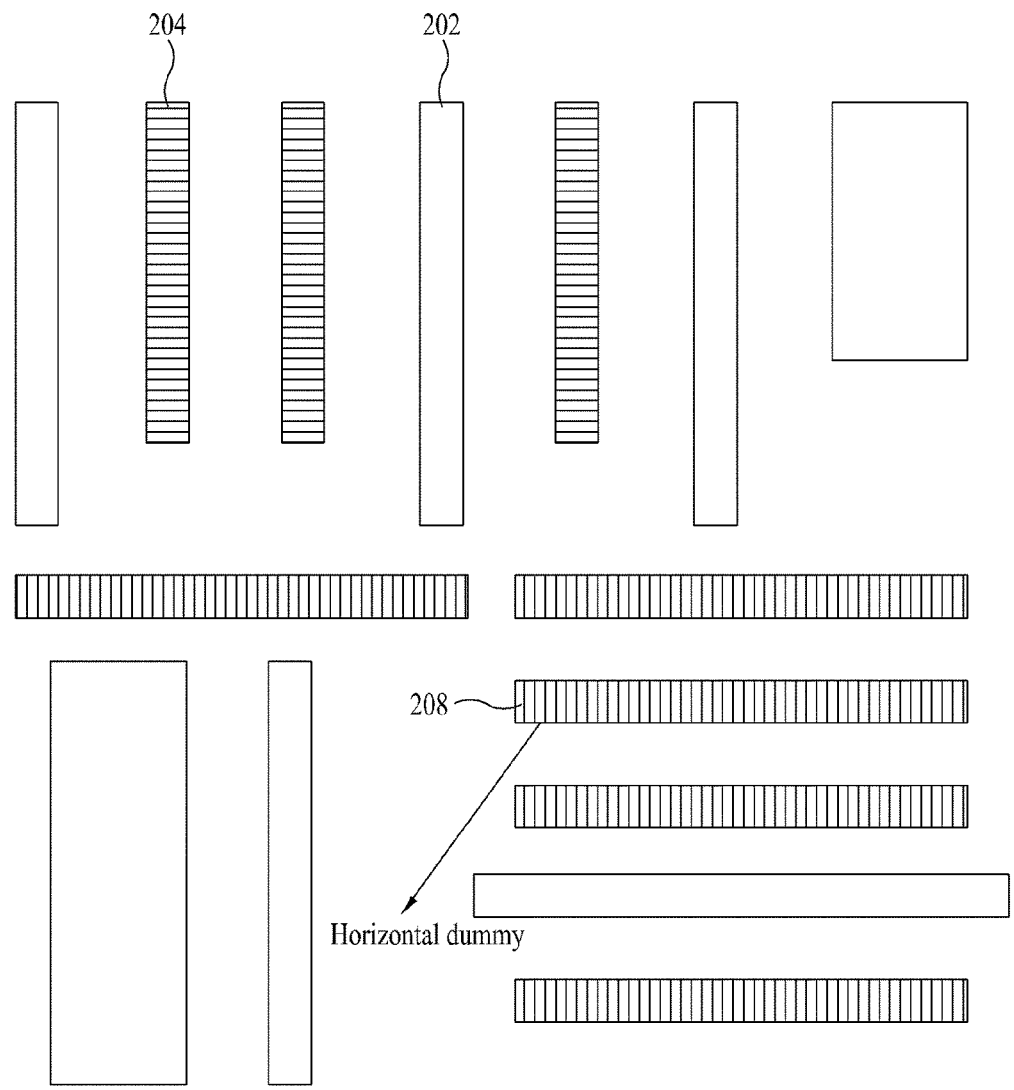

Referring to FIG. 2C, horizontal dummies 208 are arranged in a vacant space of the second layout to form a third layout. Here, the vertical dummies 204 may be the same size and shape, and the horizontal dummies 208 may be the same size and shape. The vertical dummies 204 and the horizontal dummies 208 may be rotated 90 degrees relative to each other. Naturally, the horizontal dummies 208 can be placed first (in which case, the layout can be rotated by 90° and the horizontal dummies 208 can be arbitrarily considered to be "vertical" dummies), and the vertical dummies 204 placed second.

Figure 2D:
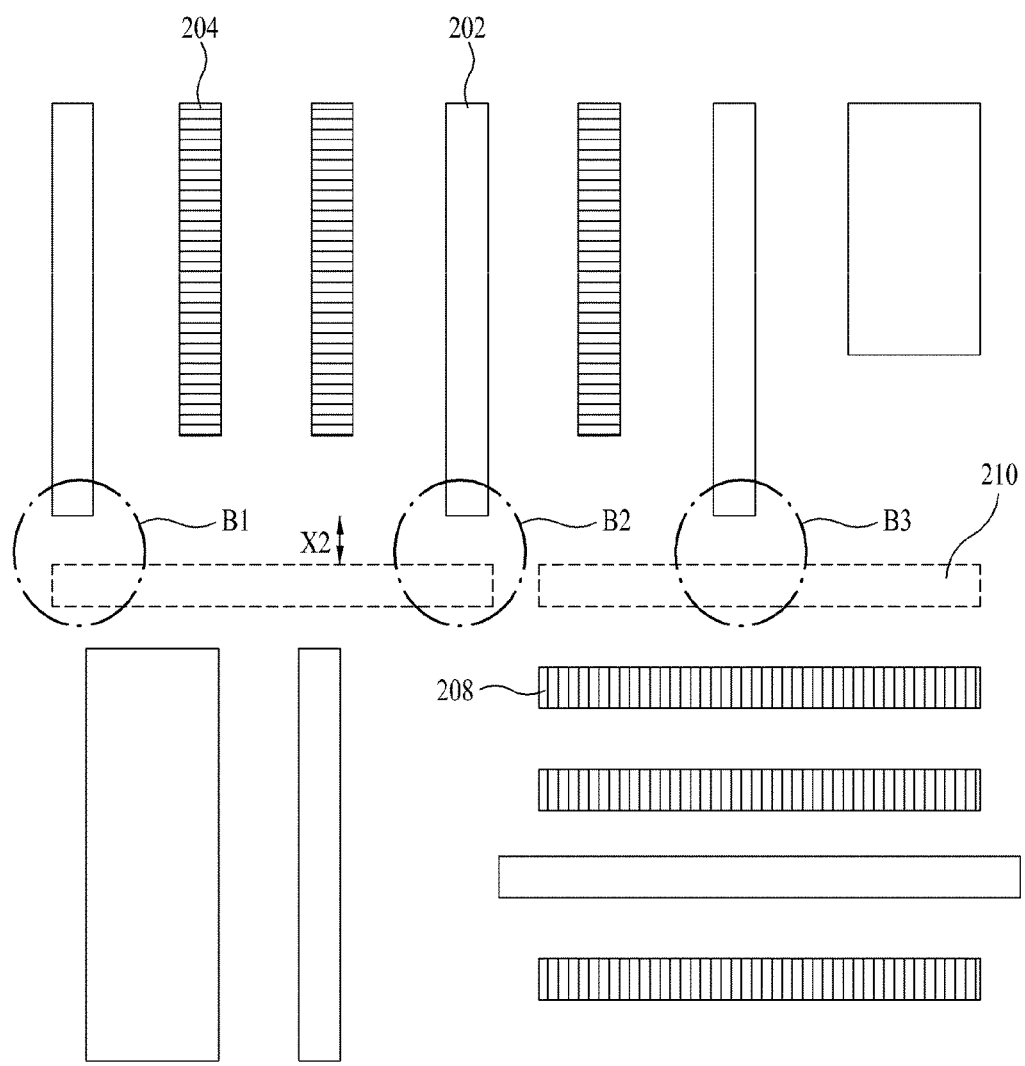

Referring to FIG. 2D, when a horizontal dummy (e.g., 208) is spaced within a second distance X2 from the main pattern 202 in the third layout, the horizontal dummy 210 may be removed to form a second layout. In an embodiment where second distance X2 corresponds to a minimum design rule, and the distance between a main pattern line and a horizontal dummy does not conform with the minimum design rule (or rules) for that layer, the horizontal dummy (e.g., dummy 210) is considered to be a rule-violation dummy, and it is removed from the electronic representation of the layout (e.g., the design of the integrated circuit or semiconductor device).

The term "second distance" refers to the distance between the main pattern 202 and the horizontal dummy 208, which in various implementations may correspond to a multiple of the width W of the horizontal dummy 208. The second distance may have a value not more than 1. 1.2, 1.25 or 1.5 times the width W of the horizontal dummy 208.

The rule-violation horizontal dummy 210 that is a distance from the main pattern 202 that violates the minimum rule is removed to reduce, inhibit or prevent deformation which may occur upon actual realization or manufacture of patterns on a wafer.

In one embodiment of the present invention, it is assumed that the design rule, in a case where the distance between the main pattern 202 and the horizontal dummy 208 is less than 1.5 times the width W of the horizontal dummy 208, is contrary to the minimum rule. As can be seen from FIG. 2D, rule violation occurs in the parts "B1", "B2" and "B3," and the corresponding dummies 210 are thus removed.

Where the dummy patterns 204 and 210 comprise or are implemented in photoresist, after development of the mail patterns and the dummy patterns, a second mask may be formed over the main patterns, thereby exposing the dummy patterns, which can be removed (along with the second mask) by dry etching or ashing to avoid formation of additional structures in the semiconductor device that have no electrical function.

In accordance with the sequence as mentioned above, the layout of the dummy patterns is completed. Through the dummy pattern insertion and removal (e.g., design) method, it is possible to densely interpose the micro dummy patterns 202 between the main patterns 202 and thus to form as many of the dummy patterns 202 as possible close (but not too close) to the main patterns 202. As a result, pattern deformation can be reduced or prevented upon actual realization and/or manufacture of the main patterns 202 on a wafer.

Figure 3:
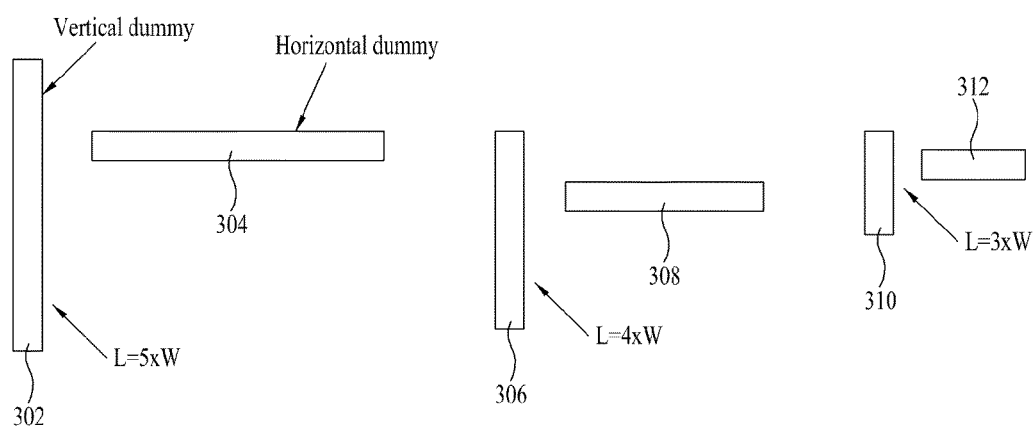
FIG. 3 is a view illustrating exemplary size variations of dummy patterns in accordance with an embodiment of the present invention.

FIG. 3 is a view illustrating an embodiment where the size of dummy patterns is varied. For example, the size may be varied in accordance with variation in the density of main patterns. Here, the dummies are classified into vertical and horizontal dummies, the sizes of the dummies are represented by the width W and length L, and the lengths of the vertical and horizontal dummies are determined by a multiple of the width thereof.

Here, the sizes of the horizontal and vertical dummies are inversely proportional to the density of the main patterns. Referring to FIG. 3, when the density of the main patterns is high, it is preferable that the dummy patterns have a short length L, so that they can be more densely interposed between the main patterns. For example, a vertical dummy 310 that has a length equal to 3 times the width thereof, and a horizontal dummy 312 that has a width equal to 3 times the length thereof, may be selected as the dummy pattern in a relatively high density layout area (e.g., where the spacing between dummy 310/312 and each of the nearest main patterns on opposite sides is within 1.5-2, 1.5-2.5 or 1.5-3 times the width of the dummy pattern 310/312).

When the density of the main patterns is intermediate, for example, the length of a vertical dummy 306 that has a length equal to 4 times a width thereof, and a horizontal dummy 308 that has a width equal to 4 times the length thereof, may be selected. The intermediate density layout area may be one where the spacing between dummy 310/312 and each of the nearest main patterns on opposite sides is within 2-5, 2.5-4.5 or 3-4 times the width of the dummy pattern 310/312).

When the density of the main patterns is low, for example, the length of a vertical dummy 302 that has a length equal to 5 times a width thereof, and a horizontal dummy 304 that has a width equal to 5-fold of the length thereof, may be selected. The low density layout area may be one where the spacing between dummy 310/312 and each of the nearest main patterns on opposite sides is at least 3, 4 or 5 times the width of the dummy pattern 310/312.

Figure 1A:
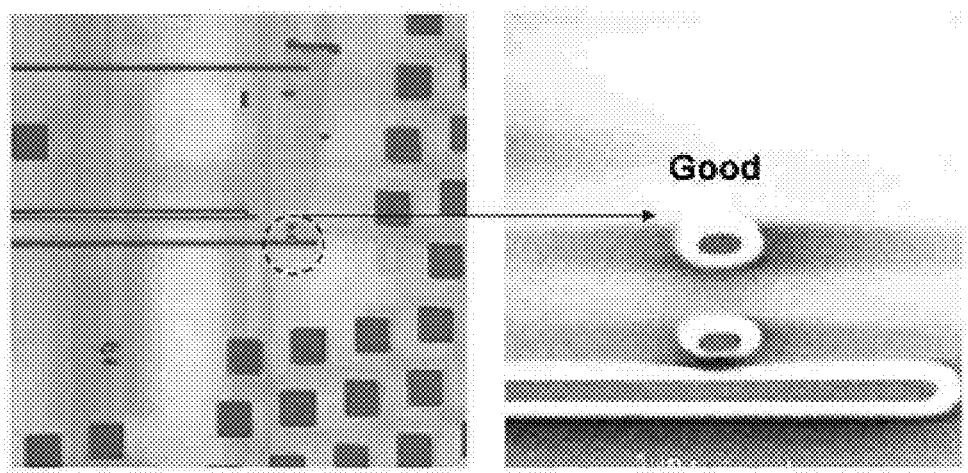
FIGS. 1A and 1B are a magnified image and a scanning electron microscopy (SEM) image illustrating a wafer surface including dummy patterns and main patterns of a general semiconductor device.
Figure 1B:
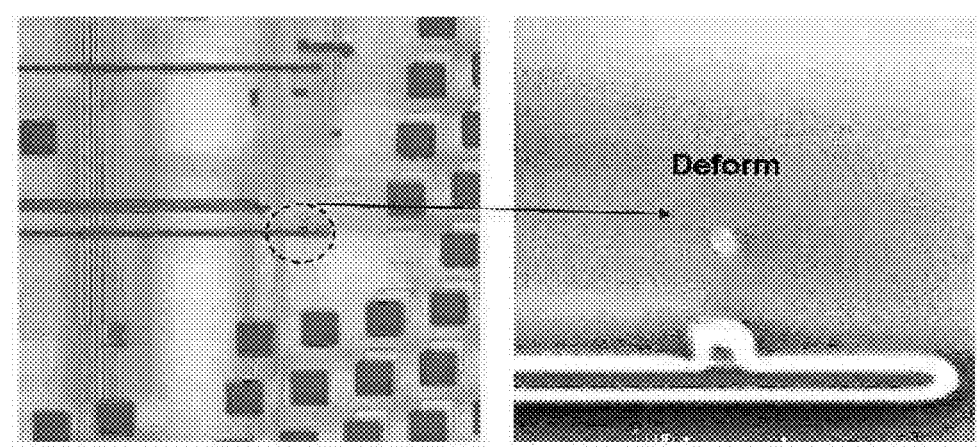

As a consequence, the size of the dummy patterns can be variably selected, depending on the density and/or spacing of the main patterns. When the size of the dummy patterns is selected, the vertical and horizontal dummies may then be placed in accordance with the dummy pattern design sequence as shown in FIGS. 2A to 2D, and the micro dummy patterns can be densely interposed between the main patterns. As a result, a maximum number of micro dummy patterns can be formed close to high-density main patterns without causing pattern deformation as shown in FIG. 1B.

As apparent from the above description, through the method for placing dummy patterns in a semiconductor device (or device layout) according to the present invention, the dummy patterns can be formed close to main patterns and can be densely arranged therebetween. Accordingly, the method has an advantage of reducing a phenomenon in which the main patterns are not formed or are incompletely formed upon actual realization and/or manufacture on a wafer. Furthermore, the method enables dense arrangement of the dummy patterns, thus advantageously realizing the stability of an overall process.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A semiconductor device layout comprising:
   main patterns;
   vertical dummies in a region other than the main patterns and at least a first distance away from each of the main patterns, each of the vertical dummies having a greater length than width and a size that is inversely proportional to a density of the main patterns, and the first distance corresponds to a minimum design rule; and
   horizontal dummies in a vacant space other than the main patterns and the vertical dummies, and not within a second distance of any of the main patterns, each of the horizontal dummies having a greater width than length and a size that is inversely proportional to the density of the main patterns.

2. The semiconductor device layout according to claim 1, wherein the vertical and horizontal dummies have a rectangle shape.

3. The semiconductor device layout according to claim 1, wherein the vertical dummies within the first distance from the main patterns in the first layout violate a minimum design rule.

4. The semiconductor device layout according to claim 1, wherein the vertical dummies and the horizontal dummies have shapes rotated 90 degrees relative to each other.

5. The semiconductor device layout according to claim 1, wherein the length of the vertical dummies and the width of the horizontal dummies are a multiple of the width of the vertical dummies and the length of the horizontal dummies, respectively.

6. The semiconductor device layout according to claim 1, wherein the first distance has a value not more than 1.5 times the width of the vertical dummies.

7. The semiconductor device layout according to claim 1, wherein the second distance has a value not more than 1.5 times the width of the horizontal dummies.

8. The semiconductor device layout according to claim 1, wherein the vertical dummies in the first layout have identical sizes and shapes, and the horizontal dummies in the first layout have identical sizes and shapes.

9. A semiconductor device layout, comprising:
   main patterns;
   vertical dummies in a region other than the main patterns and at least a first distance away from each of the main patterns, each of the vertical dummies having a a first fixed width and greater length than the first fixed width, and the first distance corresponds to a minimum design rule and is not more than 1.5 times the first fixed width; and
   horizontal dummies in a vacant space other than the main patterns and the vertical dummies, and not within a second distance of any of the main patterns, each of the horizontal dummies having a first fixed length and a greater width than the first fixed length, and the second distance is not more than 1.5 times the first fixed length.

10. The semiconductor device layout according to claim 9, wherein the vertical dummies have a length equal to at least 3 times a width thereof, and the horizontal dummies have a width equal to at least 3 times a length thereof.

11. The semiconductor device layout according to claim 9, wherein the vertical dummies have a length equal to at least 4 times a width thereof, and the horizontal dummies have a width equal to at least 4 times a length thereof.

12. The semiconductor device layout according to claim 9, wherein the vertical dummies have a length equal to at least 5 times a width thereof, and the horizontal dummies have a width equal to at least 5 times a length thereof.

13. The semiconductor device layout according to claim 9, wherein the vertical and horizontal dummies have a rectangle shape.

14. The semiconductor device layout according to claim 13, wherein the vertical dummies in the first layout have identical sizes and shapes, and the horizontal dummies in the first layout have identical sizes and shapes.

15. A semiconductor device layout comprising:
   main patterns;
   vertical dummies in a region other than the main patterns and at least a first distance away from each of the main patterns, each of the vertical dummies having a greater length than width, wherein the vertical dummy has a length equal to at least 3 times a width thereof, and the first distance corresponds to a minimum design rule; and
   horizontal dummies in a vacant space other than the main patterns and the vertical dummies, and not within a second distance of any of the main patterns, each of the horizontal dummies having a greater width than length, wherein the horizontal dummy has a width equal to at least 3 times a length thereof.

16. The semiconductor device layout according to claim 15, wherein the horizontal and vertical dummies have a size that is inversely proportional to a density of the main patterns.

17. The semiconductor device layout according to claim 15, wherein the vertical dummies have a first fixed width, and the first distance corresponds to a multiple of the first fixed width of the vertical dummies.

18. The semiconductor device layout according to claim 15, wherein the horizontal dummies have a first fixed length, and the second distance corresponds to a multiple of the first fixed length of the horizontal dummies.

19. The semiconductor device layout according to claim 15, wherein the vertical dummies in the first layout have identical sizes and shapes.

20. The semiconductor device layout according to claim 15, wherein the horizontal dummies in the first layout have identical sizes and shapes.

* * * * *